(12) United States Patent
Lee et al.

(10) Patent No.: US 6,262,938 B1
(45) Date of Patent: Jul. 17, 2001

(54) SYNCHRONOUS DRAM HAVING POSTED CAS LATENCY AND METHOD FOR CONTROLLING CAS LATENCY

(75) Inventors: Jung-bae Lee; Choong-sun Shin; Dong-yang Lee, all of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/518,144

(22) Filed: Mar. 3, 2000

(30) Foreign Application Priority Data

Mar. 3, 1999 (KR) .................................................. 99-6939
Jun. 5, 1999 (KR) ................................................. 99-20821

(51) Int. Cl.[7] ..................................................... G11C 8/00
(52) U.S. Cl. ......................... 365/233; 365/194; 365/240; 365/236
(58) Field of Search ............................. 365/78, 194, 205, 365/230.02, 230.03, 236, 240, 233

(56) References Cited

U.S. PATENT DOCUMENTS 5,587,950 * 12/1996 Sawada et al. ....................... 365/201
5,835,956   11/1998 Park et al. .
6,088,255 *  7/2000 Matsuzaki et al. ..................... 365/76

* cited by examiner

Primary Examiner—David Nelms
Assistant Examiner—Thong Le
(74) Attorney, Agent, or Firm—Jones Volentine, L.L.C.

(57) ABSTRACT

A synchronous DRAM (SDRAM) having a posted column access strobe (CAS) latency and a method of controlling CAS latency are provided. In order to control a delay time from the application of a CAS command and a column address to the beginning of memory, reading or writing operations in units of clock cycles, a first method of programing the delay time as a mode register set (MRS) and a second method of detecting the delay time using an internal signal and an external signal, are provided. In the second method, the SDRAM can include a counter for controlling the CAS latency. This counter controls the CAS latency of the SDRAM by generating a signal for controlling the CAS latency according to the number of clock cycles of a clock signal from the generation of a row access command to a column access command in the same memory bank and reading the signal. It is therefore possible to appropriately perform a posted CAS latency operation and a general CAS latency operation by the SDRAM without an additional MRS command according to this SDRAM and the method of controlling the CAS latency.

24 Claims, 11 Drawing Sheets

SYNCHRONOUS DRAM HAVING POSTED CAS LATENCY AND METHOD FOR CONTROLLING CAS LATENCY

This application relies for priority upon Korean Patent Application Nos. 99-6939 and 99-20821, filed on Mar. 3, 1999, and Jun. 5, 1999, respectively, the contents of which are herein incorporated by reference in their entirety.

BACKGROUND OF THE INVENTION

The present invention relates to a synchronous DRAM (SDRAM). More particularly, the present invention relates to an SDRAM having a column access strobe (CAS) latency, as well as a method for controlling the CAS latency.

In general, an SDRAM is synchronized with a clock signal input from outside the circuit and so the read or write operation of the SRAM is controlled. FIG. 13 describes the latency from the application of a row access command or a column access command to the output of data.

The number of clock cycles of an external clock signal from the application of a row access command to the output of first data is called the RAS latency (RL). The number of clock cycles of the external clock signal from the application of a column access command to the output of the first data is called the CAS latency (CL). The number of clock cycles of the external clock signal from the application of the row access command to the application of the column access command with respect to the same memory bank is called the RAS-CAS latency (RCL). The relationship between RCL, RL, and CL is shown in Equation 1.

$$RL = RCL + CL \quad (1)$$

When the minimum value of the RAS latency in the frequency of a specific external clock signal is $RL_{min}$, then RL must satisfy Equation 2.

$$RL \geq RL_{min} \quad (2)$$

When the minimum value of the CAS latency in the frequency of the specific external clock signal is $CL_{min}$, then $RCL_{min}$ (the minimum RAS-CAS latency) is expressed as shown in Equation 3.

$$RCL_{min} = RL_{min} - CL_{min} \quad (3)$$

In a system using an SDRAM, a function of normally outputting data even when $RCL<RCL_{min}$, namely, in posted CAS latency, is required in order to improve the performance of the system. In this application, posted CAS latency refers to the fact that the CAS command comes earlier than the conventional $RCL_{min}$. In other words, $RL \geq RL_{min}$, which is generally the product specification, must be satisfied even when $RCL<RCL_{min}$. In order to satisfy the equality $RL \geq RL_{min}$ in the posted CAS latency, the CAS latency CL must satisfy Equation 4

$$CL > CL_{min} + (RCL_{min} - RCL) \quad (4)$$

In a conventional SDRAM, since the specification of $(RCL_{min} - RCL) < 0$ is required, it is enough to determine the CL, which guarantees the minimum CAS latency $CL_{min}$ by a mode register set (MRS) command. However, in a posted CAS state, it is possible to input a CAS command (including a column address command), which controls an appropriate delay time and the latency of a data path only when each of the values in Equation 4, i.e., $(RCL_{min} - RCL)$ and $CL_{min}$, are known.

SUMMARY OF THE INVENTION

It is an object of the present invention to provide a synchronous DRAM (SDRAM) by which it is possible to perform a posted column access strobe (CAS) command.

It is another object of the present invention to provide a method for outputting data using the SDRAM.

Accordingly, to achieve the first object, A synchronous DRAM (SDRAM), operating in synchronization with a clock signal, is provided. The SDRAM comprises a memory bank having a plurality of memory cells arranged in rows and columns, a column decoder for selecting a column of the memory bank, a column address input port for inputting a column address that selects the column of the memory bank, a first shift register for delaying the column address by a first number of delay clock cycles between the column address input port and the column decoder, and a delay counter for sensing the number of clock cycles RCL of the clock signal from the application of the row access command to the application of the column access command with respect to the same bank, and for providing a first delay clock control signal to the first shift register. $RL_{min}$ is the minimum number of clock cycles of the clock signal required from the application of a row access command to the output of the data of the memory, and $CL_{min}$ is the minimum number of clock cycles of the clock signal required from the application of a column access command to the output of the data of the memory cell. The first delay clock control signal has information on the difference between RCL and $(RL_{min} - CL_{min})$, and the first number of delay clock cycles is determined in response to the difference between RCL and $(RL_{min} - CL_{min})$.

The first shift register my comprise a plurality of registers serially coupled to each other for continuously transmitting the column address in response to the clock signal of every period, and a multiplexer for selectively providing one signal among the output signals of the plurality of registers to the column decoder. The registers are preferably D flip-flops.

The delay counter may comprise a down counter for reducing the value of $(RL_{min} - CL_{min})$ by 1 in response to the clock signal, a register for providing a first delay clock control signal having information on an output value stored as an output value of the down counter when the column access command is generated or an output value of the down counter having the value of 0 to the first shift register after the row access command is generated, a clock controller that is disabled when the output value of the down counter is 0, for providing a first clock control signal which is enabled by the generation of the row access command and responds to the clock signal to the down counter, and a logic unit disabled by the generation of the column access command, for providing a second clock control signal that is enabled by the generation of the row access command and responds to the first clock control signal. The delay counter may further comprise an RCL measuring unit for providing an output signal activated by the generation of the row access command and disabled by the generation of the column access command to the logic unit.

The synchronous DRAM may further comprise a second shift register for delaying the output data of a selected memory cell by $CL_{min}$, and a buffer for buffering the output signal of the second shift register and delaying the output signal of the second shift register by a second number of delay clock cycles in response to a second predetermined delay clock control signal.

The SDRAM may further comprising a buffer controller for generating a second delay clock control signal for controlling the buffer. The buffer controller itself may comprise a first register for delaying the column access command by the second number of delay clock cycles and outputting the delayed column access command, every cycle of the clock signal, and a second register for delaying the output signal of the first register by $CL_{min}$ and generating a second delay control signal for controlling the buffer.

A synchronous DRAM (SDRAM) operating in synchronization with a clock signal, is also provided. The SDRAM comprises a memory bank having a plurality of memory cells arranged in rows and columns, a column decoder for selecting a column of the memory bank, a pair of bit lines for outputting data from the selected column, a sense amplifier for amplifying the data of the bit lines, a column address input port for inputting a column address for selecting the column of the memory bank, a first shift register for delaying the column address by a first number of delay clock cycles between the column address input port and the column decoder, and a delay counter for providing a first delay clock control signal having information on the difference between RCL and SAE to the first shift register. RCL is the number of clock cycles of the clock signal from the application of a row access command to the application of a column access command with respect to the same bank; SAE is the number of clock cycles of the clock signal from the application of the row access command to the point of time at which the sense amplifier is enabled are determined; and the first number of delay clock cycles is determined in response to the difference between RCL and SAE.

The first shift register may comprise a plurality of registers serially coupled to each other, for continuously transmitting the column address every cycle of the clock signal, and a multiplexer for selectively providing one signal among the output signals of the registers to the column decoder in response to the difference between RCL and SAE. Preferably, the registers are D flip-flops.

The delay counter may comprise a first counting circuit for counting SAE and generating a first number of clock cycles, a second counting circuit for counting RCL and generating a second number of clock cycles, and a subtracter for calculating a third number of clock cycles by subtracting the first number of clock cycles from the second number of clock cycles and using 0 as the third number of clock cycles when the first number of clock cycles is larger than the second number of clock cycles.

The first counting circuit may comprise a first logic latch unit for generating a first logic latch output signal activated by the generation of the row access command and deactivated by the activation of the sense amplifier enable signal, and a first counter enabled in a period when the first logic latch output signal is activated, for counting the number of clock cycles of the clock signal generated in the activation period, and for generating the number of first clock cycles. The second counting circuit may comprise a second logic latch unit for generating a second logic latch output signal activated by the generation of the row access command and deactivated by the generation of the column access command, and a second counter enabled in a period where the second logic latch output signal is activated, for counting the number of clock cycles of the clock signal generated in the activation period, and for generating the number of second clock cycles.

The delay counter may comprise a logic unit for generating a logic output signal that is activated in response to the generation of the column access command and is deactivated in response to a sense amplifier enable signal, the logic output signal operating to enable the sense amplifier, and a clock counter for counting the number of clock cycles of the clock signal generated in a period where the output signal of the logic unit is activated.

The synchronous DRAM may further comprise a second shift register for delaying the output data of the memory cell by $CL_{min}$, where $CL_{min}$ is the minimum number of clock cycles of the clock signal required from the application of a column access command to the output of the data of the memory cell, and a buffer for buffering the output signal of the second shift register, and for delaying the output signal of the second shift register by the first number of delay clock cycles in response to a second delay clock control signal.

The synchronous DRAM may further comprise a buffer controller for generating a second delay clock control signal for controlling the buffer. The buffer controller may itself comprise a first register for delaying the column access command by the first number of delay clock cycles and outputting the delayed column access command, and a second register for generating a second delay control signal for delaying the output signal of the first register by the first number of delay clock cycles and controlling the buffer every cycle of the clock signal. The first delay clock signal is preferably provided from outside of the SDRAM.

A synchronous DRAM (SDRAM) synchronized with a clock signal after predetermined column access strobe (CAS) latency has lapsed from a column access command, is also provided. The SDRAM comprises a memory bank having a plurality of memory cells arranged in rows and columns, and a decoder for selecting one of the memory cells based on a column address and a row address. The CAS latency is determined by the number of clock cycles of the clock signal from the application of a row access command to the application of a column access command with respect to the memory bank.

A synchronous DRAM (SDRAM) is also provided, comprising a memory bank having a plurality of memory cells arranged in rows and columns, and a decoder for selecting one of the memory cells based on a column address and a row address. $RL_{min}$ is the minimum number of clock cycles of the clock signal required from the application of a row access command to the output of the data of the selected memory cell; $CL_{min}$ is the minimum number of clock cycles of the clock signal required from the application of a column access command to the output of the data of the selected memory cell; and RCL is the number of clock cycles of the clock signal from the application of a row access command to the application of a column access command with respect to the memory bank. A CAS latency, which is the number of clock cycles of the clock signal required from the application of the column access command to the output of data, is determined to be $(RL_{min}-RCL)$ when RCL is less than $(RL_{min}-CL_{min})$, and is determined to be $CL_{min}$ when RCL is not less than $(RL_{min}-CL_{min})$. The quantity $(RL_{min}-CL_{min})$ is preferably input from the outside of the SDRAM.

A synchronous DRAM (SDRAM), operating in synchronization with a clock signal, is also provided. The SDRAM comprises a memory bank having a plurality of memory cells arranged in rows and columns, a column decoder for selecting the column of the memory bank, a pair of bit lines for outputting data from a selected memory cell, and a sense amplifier for amplifying the data of the pair of bit lines. $RL_{min}$ is the minimum number of clock cycles of the clock signal required from the application of a row access command to the output of the data of the selected memory cell; $CL_{min}$ is the minimum number of clock cycles of the clock signal required from the application of a column access command to the output of the data of the selected memory cell; RCL is the number of clock cycles of the clock signal from the application of a row access command to the application of a column access command with respect to the memory bank; and SAE is the number of clock cycles of the clock signal from the application of the row access command to the point of time at which the sense amplifier is enabled. The CAS latency, which is the number of clock cycles of the clock signal required from the application of the column access command to the output of data, is determined by the difference between RCL and SAE.

The CAS latency is preferably determined to be ($RL_{min}$−RCL) when RCL is less than SAE and the difference between RCL and SAE is no less than the predetermined number of reference clock cycles, and is determined to be $CL_{min}$ when RCL is no less than SAE and the difference between RCL and SAE is no more than the number of reference clock cycles.

A method of controlling CAS latency of an SDRAM, synchronized with a clock signal, that includes a memory bank having a plurality of memory cells arranged in rows and columns and outputs the data of a selected memory cell, is also provided. The method comprises inputting a quantity ($RL_{min}$−$CL_{min}$) from the outside of the SDRAM, where $RL_{min}$ is the minimum number of clock cycles of the clock signal required from the application of a row access command to the output of the data of the selected memory cell, and $CL_{min}$ is the minimum number of clock cycles of the clock signal required from the application of a column access command to the output of the data of the selected memory cell, comparing RCL with ($RL_{min}$−$CL_{min}$), where RCL is a number of clock cycles of the clock signal from the application of a row access command to the application of a column access command with respect to the memory bank, determining CAS latency, which is the number of clock cycles of the clock signal required from the application of the column access command to the output of the data, to be ($RL_{min}$−RCL) when RCL is less than ($RL_{min}$−$Cl_{min}$), and determining the CAS latency to be $CL_{min}$ when RCL is no less than ($RL_{min}$−$CL_{min}$).

A of controlling CAS latency of an SDRAM which includes a bank having a plurality of memory cells arranged in rows and columns that outputs the data of a selected memory cell in synchronization with the clock signal, is also provided. The method comprises sensing RCL, where RCL is the number of clock cycles of the clock signal from an application of a row access command to an application of a column access command, sensing SAE, where SAE is the number of clock cycles of the clock signal from the application of the row access command to a point of time at which a sense amplifier is enabled, comparing RCL with SAE, determining CAS latency, which is the number of clock cycles of the clock signal required from the application of the column access command to the output of the data, to be ($RL_{min}$−RCL) when RCL is less than SAE and the difference between RCL and SAE is not less than a predetermined number of reference clock cycles, and determining the CAS latency to be $CL_{min}$ when RCL is not less than SAE or the difference between RCL and SAE is less than the predetermined number of reference clock cycles. $RL_{min}$ is the minimum number of clock cycles of a clock signal required from the application of a row access command to the output of the data of the selected memory cell; and $CL_{min}$ is the minimum number of clock cycles of the clock signal required from the application of a column access command to the output of the data of the selected memory cell.

According to the SDRAM and the method for controlling the CAS latency of the present invention, a posted CAS latency operation and a general CAS latency operation can be appropriately performed by the SDRAM without a mode register set (MRS) command.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Figure 1:
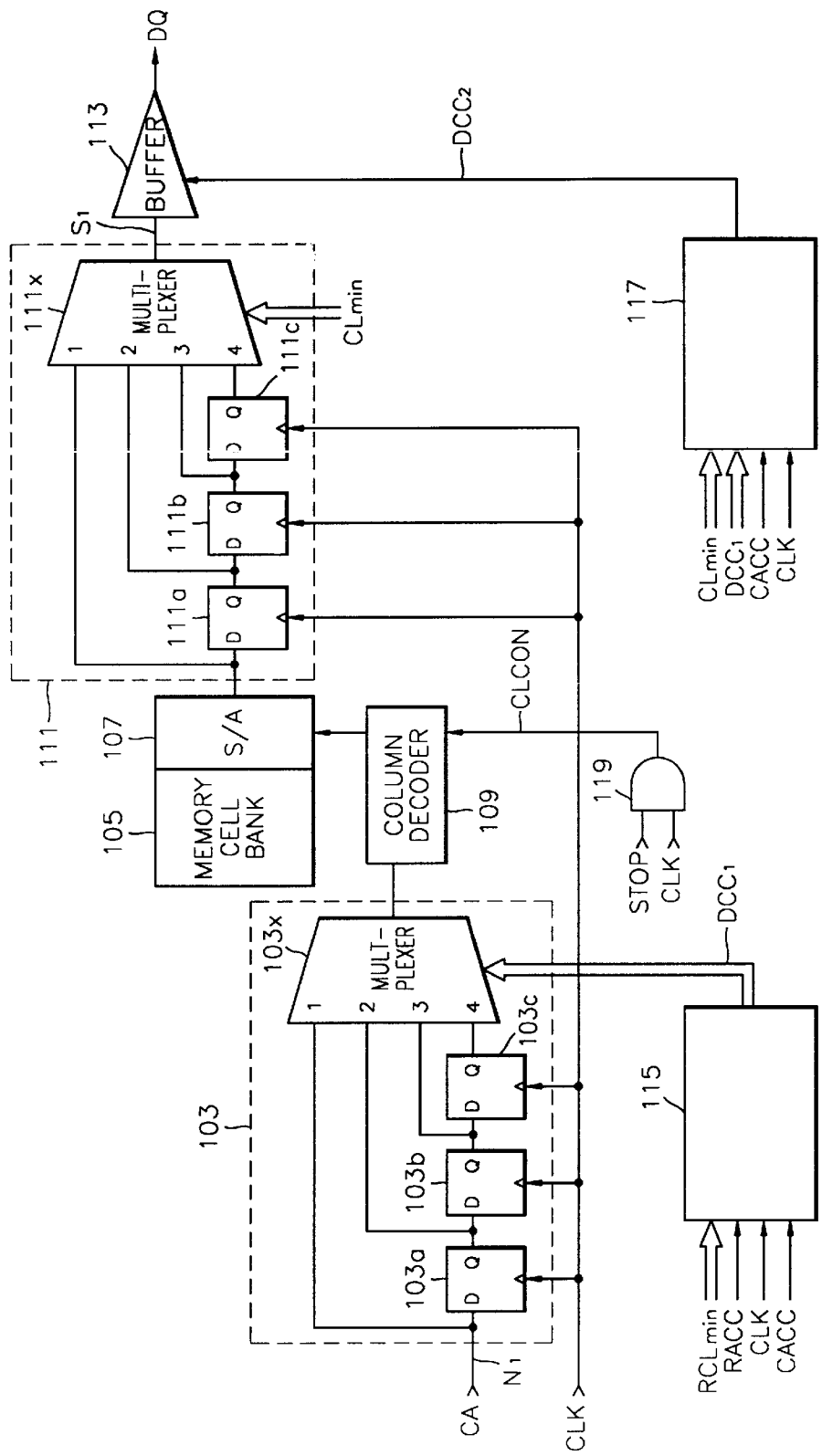
FIG. 1 is a block diagram schematically showing a synchronous DRAM (SDRAM) having a posted column access strobe (CAS) latency according to a first preferred embodiment of the present invention.

The present invention now will be described more fully with reference to the accompanying drawings, in which preferred embodiments of the invention are shown. The same reference numerals in different drawings represent the same element.

Structural elements related to the output of data from a general synchronous DRAM (SDRAM) and a data output operation are as follows. The SDRAM has a plurality of memory banks. Each memory bank includes a plurality of memory cells arranged in rows and columns. A row decoder for selecting rows and a column decoder for selecting columns are included in order to select a specific memory cell from among the plurality of memory cells included in one memory bank. The data of the memory cells of the row selected by the row decoder are then output to a pair of bit lines, and the output data is amplified by a sense amplifier.

The amplified data of the pair of bit lines corresponding to a selected column is then output to a data input and output line through a transmission switch. At this time, the transmission switch is selectively turned on by a decoded column address input through a column decoder. The data sent to the input and output line is provided to the outside through an output buffer. The output operation of the SDRAM is preferably controlled in synchronization with the clock signal input from the outside.

First Preferred Embodiment

FIG. 1 is a block diagram schematically showing an SDRAM having posted column access strobe (CAS) latency according to a first preferred embodiment of the present invention. Elements related to the present invention are shown. Referring to FIG. 1, the SDRAM according to the first preferred embodiment includes a column address input port $N_1$, a first shift register 103, a column decoder 109, a counter 115, and a memory cell bank 105.

The memory cell bank 105 includes a plurality of memory cells arranged in rows and columns, although only one is specifically shown in the specification. The column decoder 109 operates to select a column of the memory cell bank 105. The column address input port $N_1$ receives a column address CA for selecting the column of the bank 105. The first shift register 103 delays the column address CA input through the column address input port $N_1$ by a number of delay clock cycles $T_{D1}$ and provides the delayed column address to the column decoder 109. Here, the number of delay clock cycles $T_{D1}$ satisfies Equation 5.

$$T_{D1}=(RL_{min}-CL_{min})-RCL \quad (5)$$

where $RL_{min}$ represents the minimum number of clock cycles of a clock signal CLK required from the application of a row access command to the output of data from the memory cell; $CL_{min}$ represents the minimum number of clock cycles of the clock signal CLK required from the application of a column access command to the output of data from the memory cell; and RCL represents the number of clock cycles of the clock signal CLK from the application of the row access command to the application of the column access command with respect to the same memory bank.

The first shift register 103 preferably includes a plurality of registers 103a, 103b, and 103c, and a multiplexer 103x. The registers 103a, 103b, and 103c are serially coupled to each other and sequentially transmit the column address CA in response to the clock signal CLK. In operation, the column address CA is transmitted to the next register every clock cycle of the clock signal CLK. The multiplexer 103x provides one signal selected in response to a first delay clock control signal DCC, output from the counter 115, to the column decoder 109, using the output signals of the column address input port $N_1$ and the registers 103a, 103b, and 103c as input signals. The number of registers included in the first shift register 103 can be varied, although only three registers are shown in the present specification. According to the first preferred embodiment, the registers 103a, 103b, and 103c are D flip-flops.

The counter 115 senses the RAS-CAS latency (RCL) and provides the first delay clock control signal $DCC_1$, which includes information on the difference between RCL and $(RL_{min}-CL_{min})$, to the multiplexer 103x of the first shift register 103. The value of $(RL_{min}-CL_{min})$ can be input from the outside of the SDRAM through an MRS command. The structure and operation of the counter 115 will be described in detail with reference to FIG. 2.

The SDRAM according to the first preferred embodiment shown in FIG. 1 further includes a sense amplifier 107, a second shift register 111, and a buffer 113.

The sense amplifier 107 controls the transmission of the data output from the memory cell. In particular, it amplifies the data of the memory cell, which is output via a pair of bit lines.

The second shift register 111 delays the output data of the memory cell by $CL_{min}$ and provides the delayed output data to the buffer 113. Since the second shift register 111 has the same structure and operation as the first shift register 103, a detailed description of the second shift register 111 will be omitted. The multiplexer 111x of the second shift register 111 is preferably controlled by $CL_{min}$.

The buffer 113 buffers an output signal $S_1$ of the second shift register 111 and delays the output signal $S_1$ of the second shift register 111 by the number of delay clock cycles $T_{D1}$, in response to a second delay clock control signal $DCC_2$.

The first embodiment of the SDRAM further includes a buffer controller 117 for generating the second delay clock control signal $DCC_2$ that controls the buffer 113. The structure and operation of the buffer controller 117 will be described in detail with reference to FIG. 3.

An AND gate 119 is further provided in the first preferred embodiment. The AND gate 119 is enabled by a counting stop signal STOP described as follows in relation to FIG. 2, and operates to generate a column control signal CLCON in response to the clock signal CLK. The column control signal CLCON controls the operation of the column decoder 109.

Figure 2:
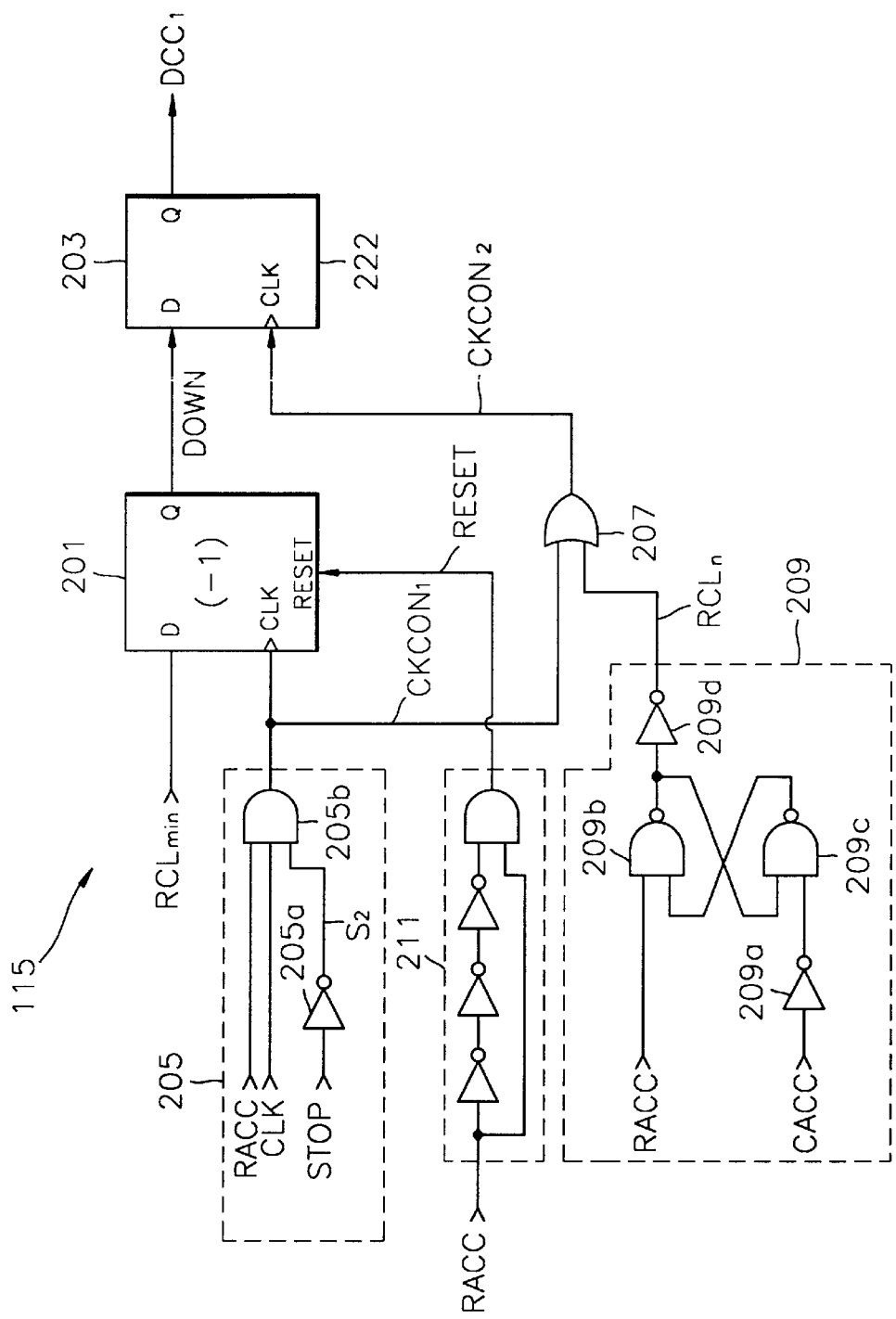
FIG. 2 is a detailed circuit diagram showing the counter of FIG. 1.

FIG. 2 is a detailed circuit diagram showing the counter 115 of FIG. 1. Referring to FIG. 2, the counter 115 includes a down counter 201, a register 203, a clock controller 205, a logic unit 207, and an RCL measuring unit 209.

The down counter 201 receives $RCL_{min}$, which is the value of $(RL_{min}-CL_{min})$, and generates an output signal DOWN having the value obtained by reducing $RCL_{min}$ by 1 in response to a first clock control signal $CKCON_1$, which is the output signal of the clock controller 205. The register 203 stores the output signal DOWN of the down counter 201 in response to a second clock control signal $CKCON_2$, which is output from the logic unit 207, and provides the first delay clock control signal $DCC_1$ to the first shift register 103 (refer to FIG. 1).

The clock controller 205 is enabled by the generation of the row access command and provides the first clock control signal $CKCON_1$ which responds to the clock signal CLK, to the down counter 201. The clock controller 205 is disabled when the value of the output signal DOWN of the down counter 201 corresponds to logic "0." This is true because the stop signal STOP is the output signal of a logic circuit that receives the signal DOWN. The stop signal STOP is enabled when the signal DOWN is logic "0."

The clock controller 205 preferably comprises an inverter 205a and an AND gate 205b. The inverter 205a inverts the counting stop signal STOP, which is activated to high when the value of the output signal DOWN of the down counter 201 corresponds to 0. The AND gate 205b performs an AND operation on a row access signal RACC, a clock signal CLK, and an output signal $S_2$ of the inverter 205a and generates the first clock control signal $CKCON_1$.

The row access signal RACC is activated to high when a row access command is generated. Therefore, the first clock control signal $CKCON_1$ responds to the clock signal CLK after the row access command is generated. However, the first clock control signal $CKCON_1$ is maintained at a low level after the output signal DOWN of the down counter 201 corresponds to 0.

When the row access command is generated, an output signal RESET of a reset controller 211 is activated and the down counter 201 is reset. Then, the first clock control signal CKCON$_1$ again responds to the clock signal CLK.

The RCL measuring unit 209 receives the row access signal RACC and a column access signal CACC and generates a RCL measuring signal RCLM which is output to the logic unit 207. Here, the column access signal CACC is activated to logic high when a column access command is generated. The RCL measuring signal RCLM is activated by the generation of the row access command and is disabled by the generation of the column access command.

According to the first embodiment, the RCL measuring unit 209 preferably comprises two invertors 209a and 209d and two NAND gates 209b and 209c. The inverter 209a inverts the column access signal CACC. The two NAND gates 209b and 209c receive the row access signal RACC and the output signal of the inverter 209a as input signals, respectively, and are cross-coupled to each other. The inverter 209d inverts the output signal of the NAND gate 209b and generates the RCL measuring signal RCLM. As a result of this logic, the RCL measuring signal RCLM is activated by the generation of the row access command and is disabled by the generation of the column access command.

The logic unit 207 performs an OR operation on the first clock control signal CKCON$_1$ and the RCL measuring signal RCLM to generate an output signal CKCON$_2$, which is provided to the clock port of the register 203. The logic unit 207 is preferably realized by a NOR gate.

The counter 115 shown in FIG. 2 receives RCL$_{min}$, the row access signal RACC, the column access signal CACC, and the clock signal CLK, and generates the first delay clock control signal DCC$_1$, which has information on (RCL$_{min}$–RCL). Here, when (RCL$_{min}$–RCL) is less than 0, the first delay clock control signal DCC$_1$ has the same information as for the case where (RCL$_{min}$–RCL) is 0.

Figure 3:
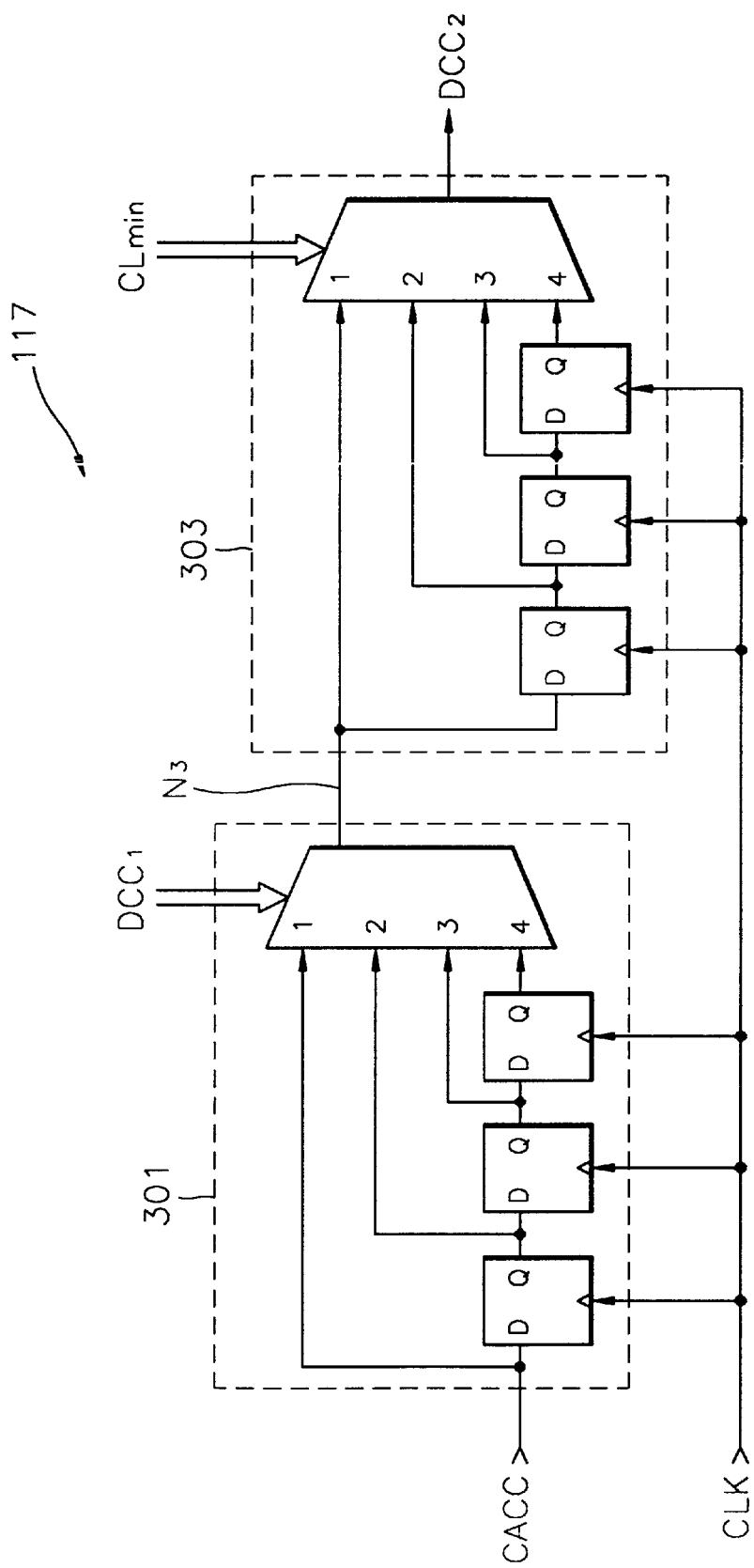
FIG. 3 is a detailed circuit diagram showing the buffer controller of FIG. 1.

FIG. 3 is a detailed circuit diagram showing the buffer controller 117 of FIG. 1. Referring to FIG. 3, the buffer controller 117 preferably includes a first register 301 and a second register 303.

The internal clock signal ICLK is preferably generated in response to the rising edge of the clock signal CLK. The first register 301 has the same structure and operation as the first shift register 101 of FIG. 1. The difference between the first register 301 and the first shift register 101 is in that the first register 301 delays the column access signal CACC by the number of delay clock cycles T$_{D1}$, while the first shift register 103 delays the column address CA by the number of delay clock cycles T$_{D1}$.

The second register 303 preferably delays the output signal N$_3$ of the first register 301 by the delay clock cycles CL$_{min}$, i.e., the minimum CAS latency, and outputs the delayed output signal as the second delay clock control signal DCC$_2$. The second register 303 preferably has the same structure and operation as the second shift register 111 of FIG. 1. The difference between the second register 303 and the second shift register 111 is in that the second register 303 delays the output signal N$_3$ of the first register 301 by CL$_{min}$ while the second shift register 111 delays the output data of the memory cell by CL$_{min}$.

Figure 4:
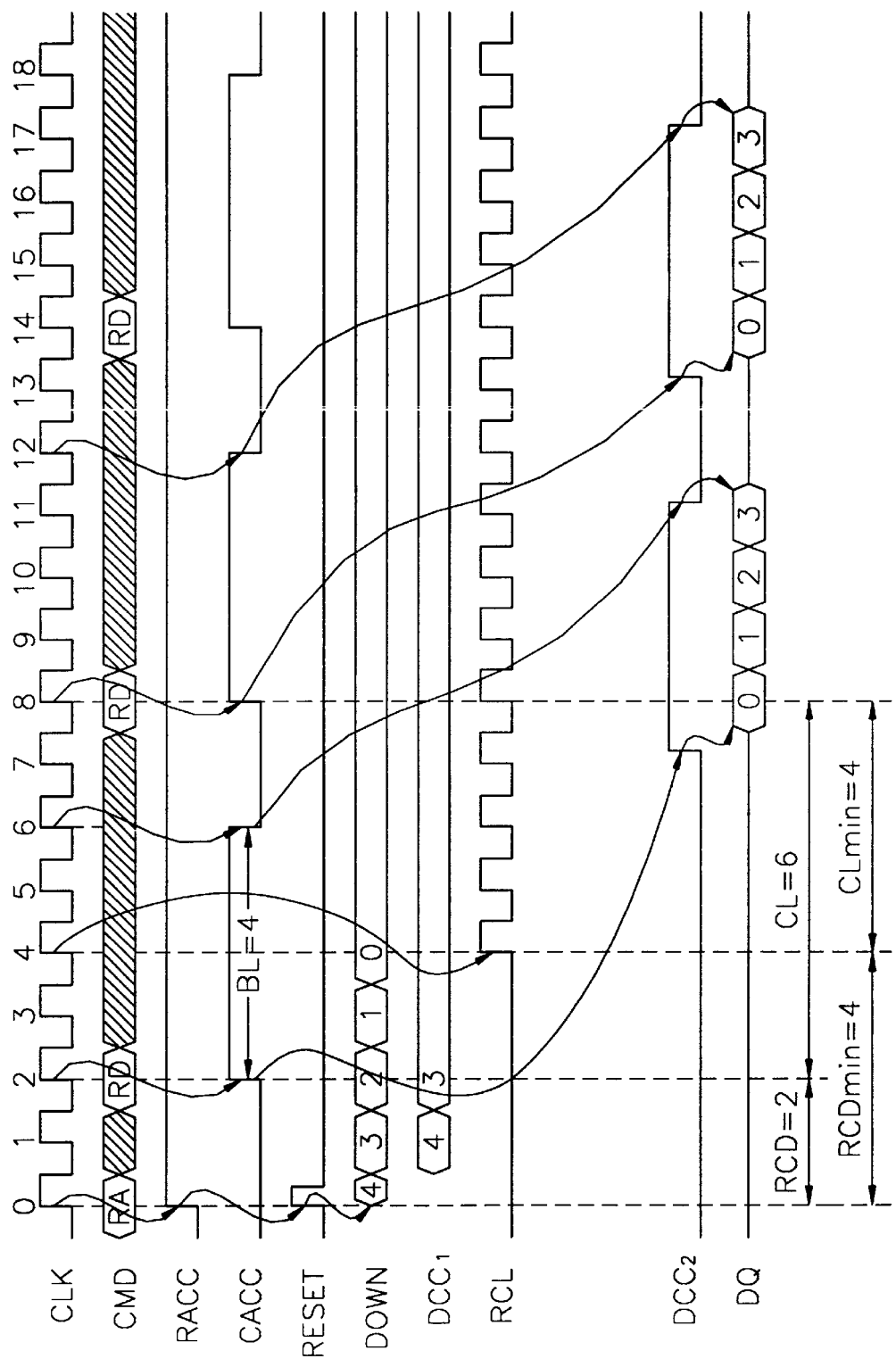
FIG. 4 is a timing diagram of the main terminal of the SDRAM in a posted CAS command mode according to the first preferred embodiment.

FIG. 4 is a timing diagram of a posted CAS command in the main terminal of the SDRAM according to the first preferred embodiment. In FIG. 4, RCL$_{min}$ is 4, CL$_{min}$ is 4, and RCL is 2. When RCL is less than RCL$_{min}$, the CAS latency CL is changed to 6. As a result, an appropriate data output operation is performed.

Figure 5:
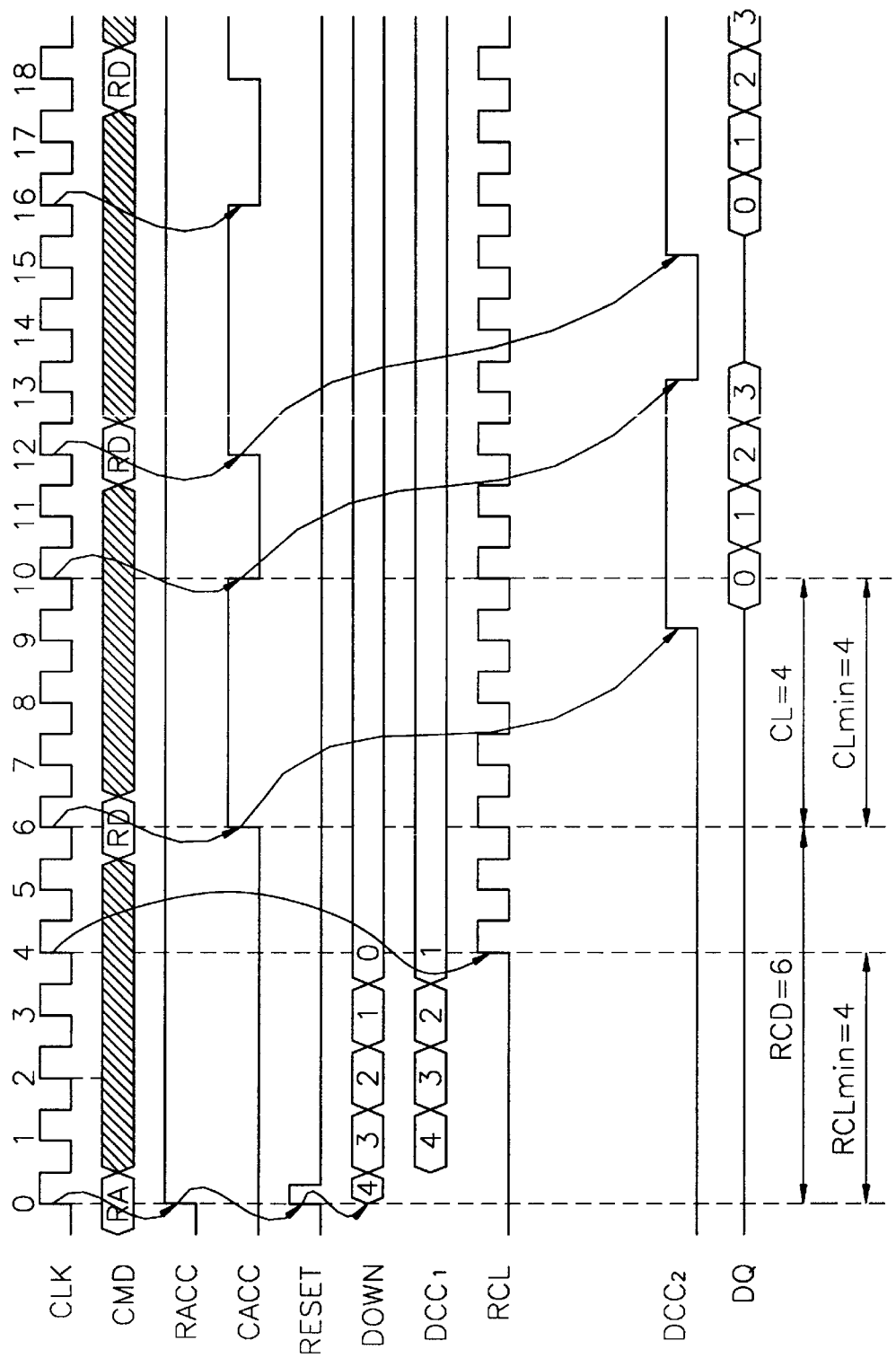
FIG. 5 is a timing diagram of the main terminal of the SDRAM in a general CAS command mode according to the first preferred embodiment.

FIG. 5 is a timing diagram of a general CAS command in the main terminal of the SDRAM according to the first preferred embodiment. In FIG. 4, RCL$_{min}$ is 4, CL$_{min}$ is 4, and RCL is 6. When RCL is larger than RCL$_{min}$, the CAS latency CL becomes 4, which is equal to CL$_{min}$. As a result, an appropriate data output operation is performed without loss of the CAS latency.

Figure 6:
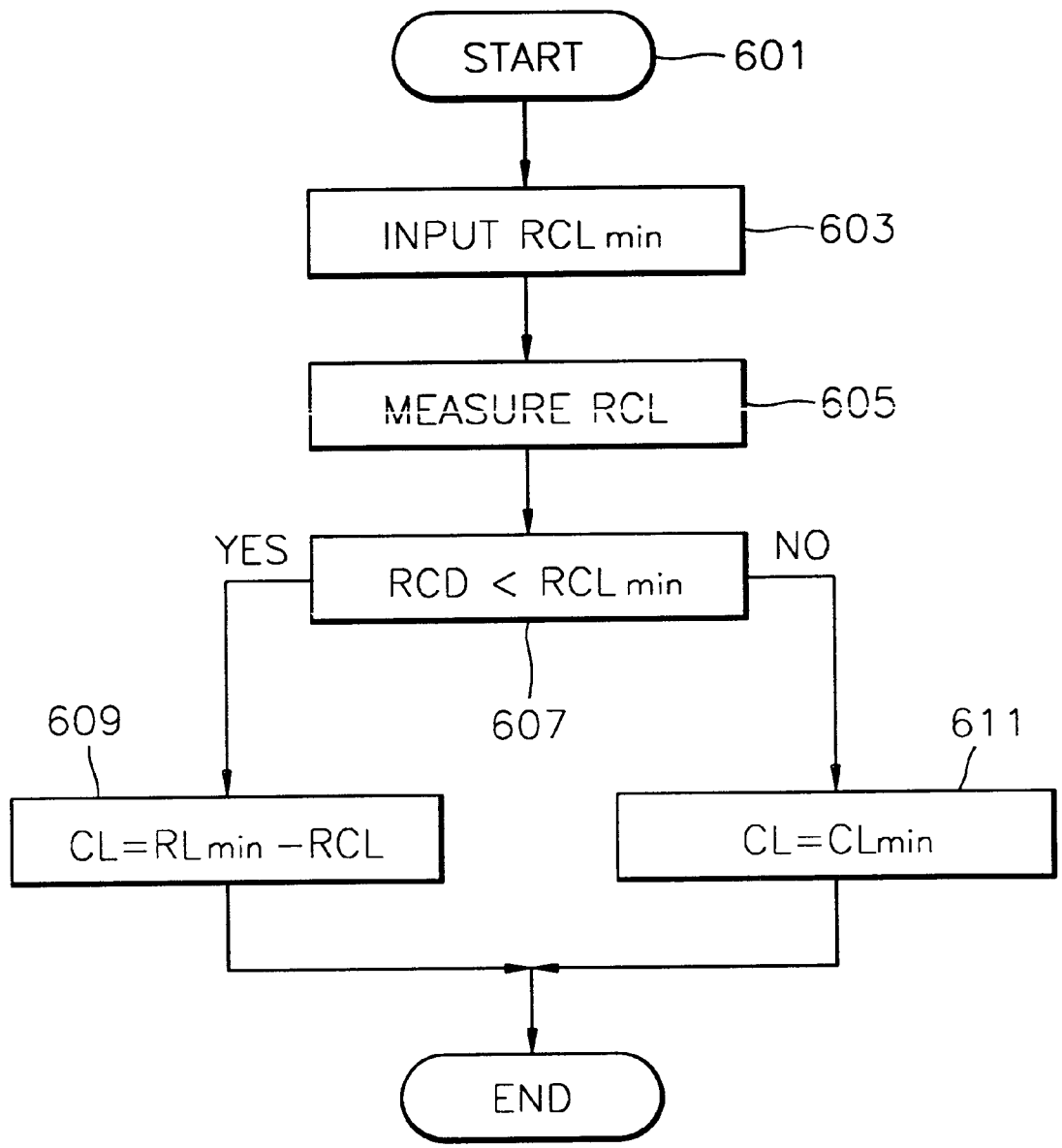
FIG. 6 is a flowchart describing a method of controlling CAS latency using the SDRAM according to the first preferred embodiment.

FIG. 6 is a flowchart describing a method of controlling the CAS latency using the SDRAM according to the first preferred embodiment. The method of controlling the CAS latency will be described with reference to FIG. 6.

Initially, a value for RCL$_{min}$ is received from the outside of the SDRAM (step 603). Then, RCL is measured (step 605), and RCL is compared with RCL$_{min}$ (step 607). When RCL is less than RCL$_{min}$, CL is determined to be (RL$_{min}$–RCL) (step 609). When RCL is not less than RCL$_{min}$, CL is determined to be CL$_{min}$ (step 611).

Second Preferred Embodiment

Figure 7:
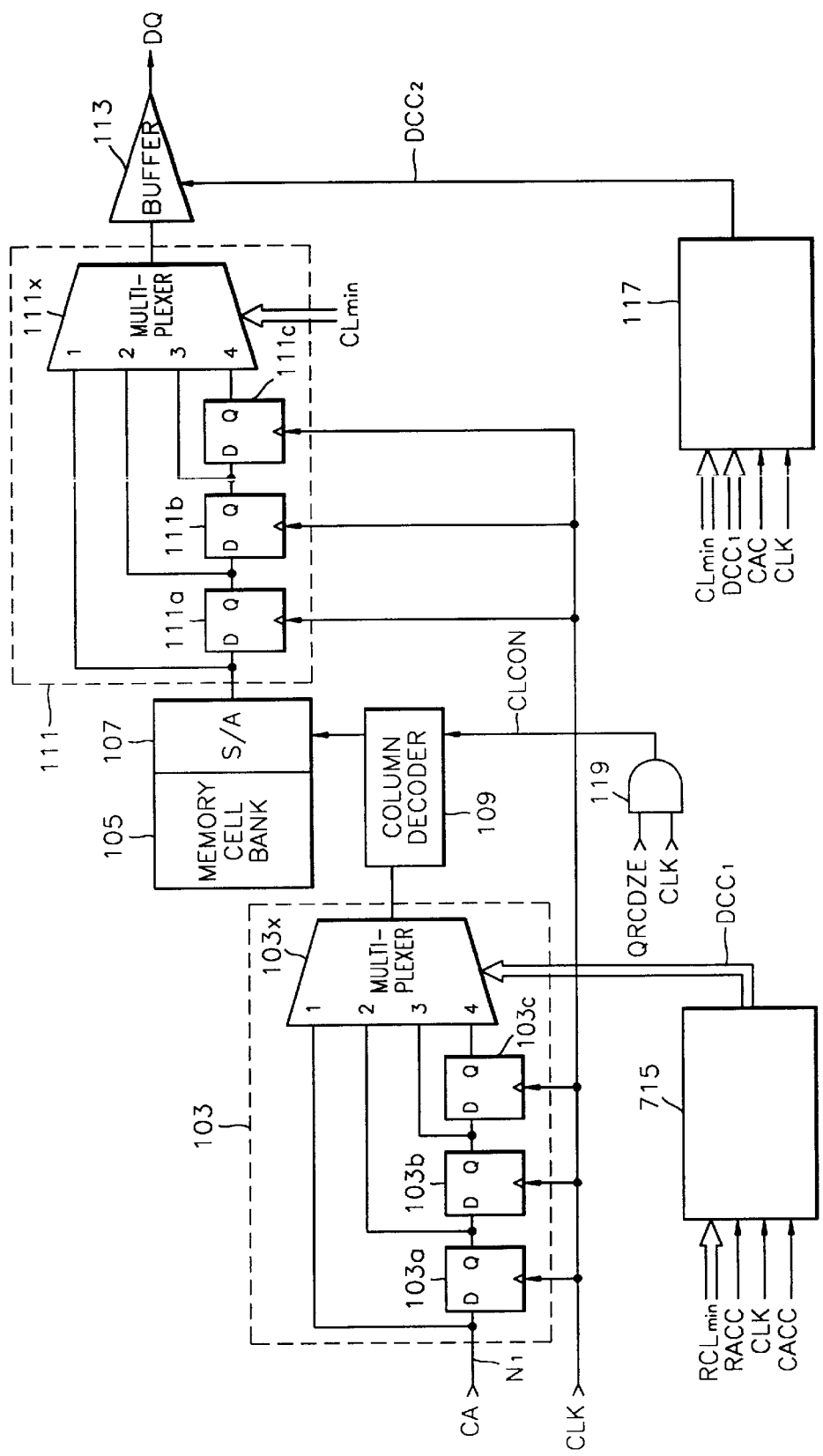
FIG. 7 is a block diagram schematically showing an SDRAM having a posted CAS latency according to a second preferred embodiment of the present invention.

FIG. 7 is a block diagram schematically showing a SDRAM having posted CAS latency according to a second preferred embodiment of the present invention. Elements related to the present invention are shown in FIG. 7. In the second preferred embodiment of FIG. 7, the same reference numerals will be used for signals that perform the same functions as corresponding signals in the first preferred embodiment of FIG. 1. The second preferred embodiment shown in FIG. 7 has a similar structure and operation as the first preferred embodiment of FIG. 1. Therefore, for the convenience of explanation, in the second preferred embodiment, only the parts whose structure and operation are different from the structure and operation of the corresponding parts of the first preferred embodiment will be described.

In the second preferred embodiment of FIG. 7, a counter 715 for generating the first delay clock control signal DCC$_1$ is different from the counter 115 of FIG. 1. The counter 715 senses RCL and the information SAE and provides the first delay clock control signal DCC$_1$ having information on the difference between RCL and the information SAE to a multiplexer 103x of a first shift register 103. The first delay clock control signal can be directly applied from the outside through means such as an MRS. The information SAE is the number of clock cycles of the clock signal CLK from the application of the row access command to the point of time at which a sense amplifier 107 is enabled. SAE is preferably measured inside the SDRAM.

The number of delay clock cycles T$_{D2}$ is generated by delaying the column address CA in the first shift register 103. The number of delay clock cycles T$_{D2}$ must satisfy Equation 6.

$$T_{D2} = RSE - RCL \qquad (6)$$

The structure and operation of the counter will be described in detail with reference to FIGS. 8 through 11.

Figure 8:
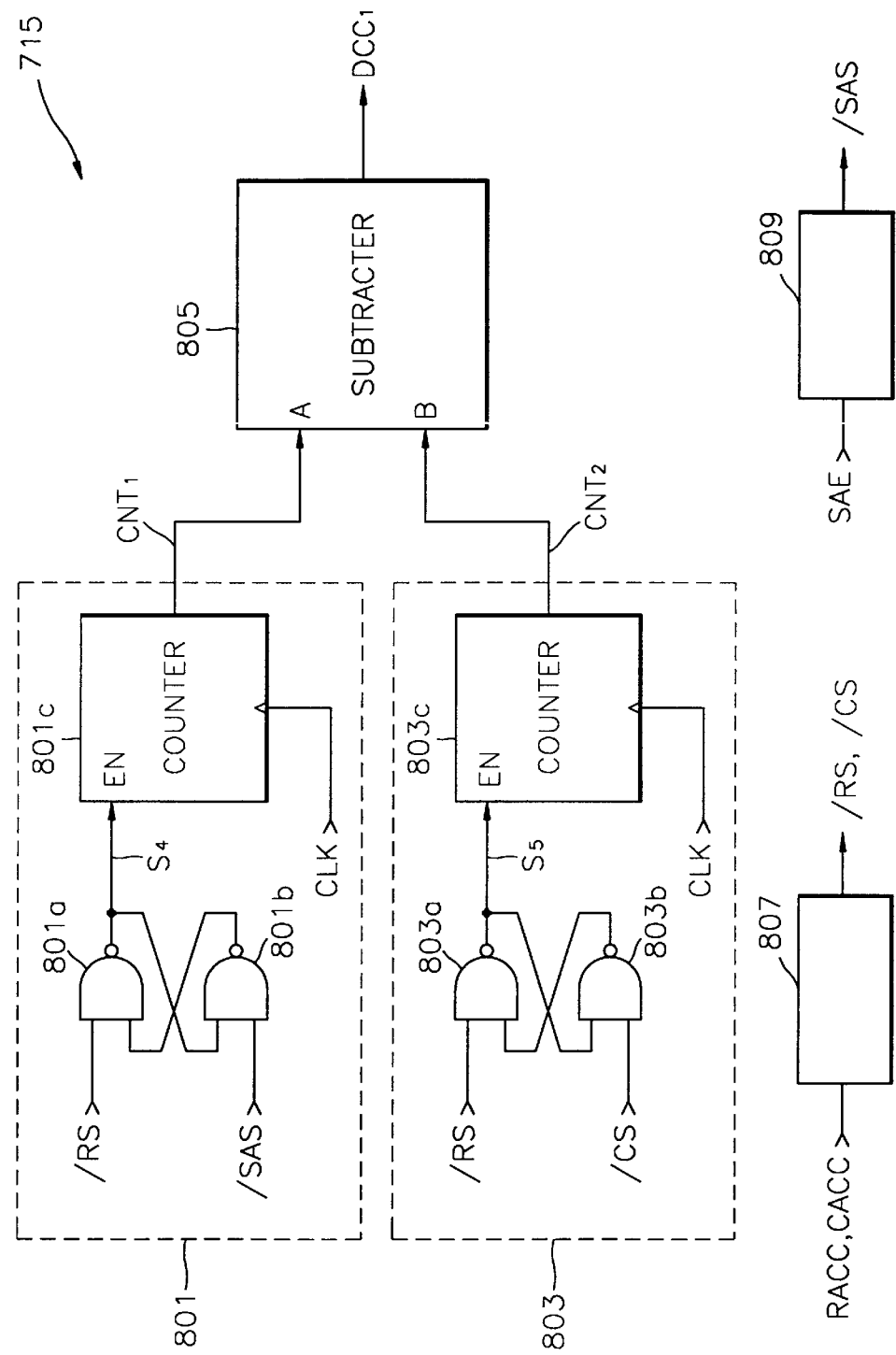
FIG. 8 is a detailed circuit diagram showing a first design for the counter of FIG. 7.

FIG. 8 is a detailed circuit diagram showing a first design for the counter 715 of FIG. 7. Referring to FIG. 8, the counter 715 includes a first counting circuit 801, a second counting circuit 803, a subtracter 805, a first sense signal generator 807, and a second sense signal generator 809.

The first counting circuit 801 counts SAE and generates the number of first clock cycles CNT$_1$. The second counting circuit 803 counts RCL and generates the number of second clock cycles CNT$_2$. The subtracter 805 subtracts the number of first clock cycles CNT$_1$ from the number of second clock cycles CNT$_2$ and generates the first delay clock control signal DCC$_1$. However, when the number of second clock cycles CNT$_2$ is less than the number of first clock cycles CNT$_1$, the first delay clock control signal DCC$_1$ has information of logic 0.

The first counting circuit 801 includes a logic latch unit and a counter 801c. According to the second preferred embodiment, the logic latch unit comprises two NAND gates 801a and 801b. The NAND gates 801a and 801b use a row sense signal/RS and a sense amplifier sense signal/SAS as inputs, respectively. The NAND gates 801a and 801b are preferably cross-coupled to each other. Here, the row sense signal/RS is generated in the form of a pulse in response to the rising transition of the row access signal RACC. The sense amplifier sense signal/SAS is generated in the form of a pulse in response to the rising transition of the sense amplifier enable signal SAE, which instructs that a sense amplifier 107 (refer to FIG. 7) be enabled. As a result of this, an output signal $S_4$ of the logic latch unit is activated by the generation of the row access command and is deactivated by the activation of the sense amplifier enable signal SAE.

The counter 801c is enabled in a period where the output signal $S_4$ of the NAND gates 801a and 801b is activated. The counter 801c counts the number of clock cycles of the clock signal CLK generated in the activation period, and provides the number of first clock cycles $CNT_1$ to the subtracter 805. As a result, the number of first clock cycles $CNT_1$ is the number of clock cycles SAE of the clock signal CLK from the application of the row access command to the point of time at which a sense amplifier 107 is enabled.

The second counting circuit 803 includes a logic latch unit and a counter 803c. According to the second preferred embodiment, the logic latch unit comprise two NAND gates 803a and 803b. The NAND gates 803a and 803b use the row sense signal/RS and a column sense signal/CS as input signals, respectively. The NAND gates 803a and 803b are also cross-coupled to each other. Here, the column sense signal/CS is generated in the form of a pulse in response to the rising transition of the column access signal CACC. Therefore, an output signal $S_5$ of the logic latch unit is activated by the generation of the row access command and is deactivated according to the activation of the column access signal CACC.

The counter 803c is enabled during a period in which the output signal $S_4$ of the logic latch units 803a and 803b counts the number of clock cycles of the clock signal CLK generated in the activation period, and provides the number of second clock cycles $CNT_2$ to the subtracter 805. As a result, the number of second clock cycles $CNT_2$ is the number of clock cycles RCL of the clock signal CLK from the application of the row access command to the application of the column access command with respect to the same memory bank.

The first sense signal generator 807 of FIG. 8 is a circuit for generating the row sense signal/RS or the column sense signal/CS in response to the row access signal RACC or the column access signal CACC. The detailed structure of the first sense signal generator 807 will be described with reference to FIG. 9. The second sense signal generator 809 of FIG. 8 is a circuit for generating the sense amplifier sense signal/SAS in response to the sense amplifier enable signal SAE. The detailed structure of the second sense signal generator 809 will be described with reference to FIG. 10.

Figure 9:
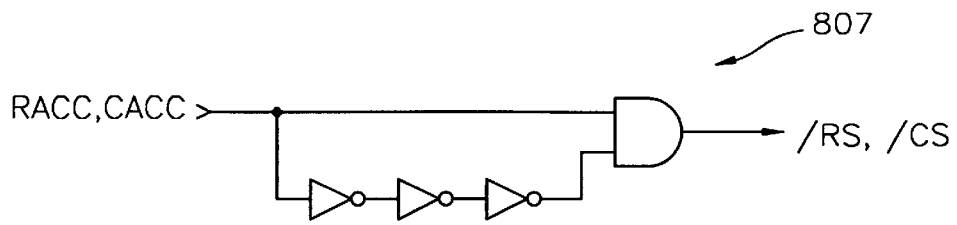
FIG. 9 is a detailed circuit diagram showing the first sense signal generator of FIG. 8.

FIG. 9 is a detailed circuit diagram showing the first sense signal generator 807 of FIG. 8. Referring to FIG. 9, both the row sense signal/RS and the column sense signal/CS are generated as a pulse in response to the row access signal RACC or the column access signal CACC.

Figure 10:
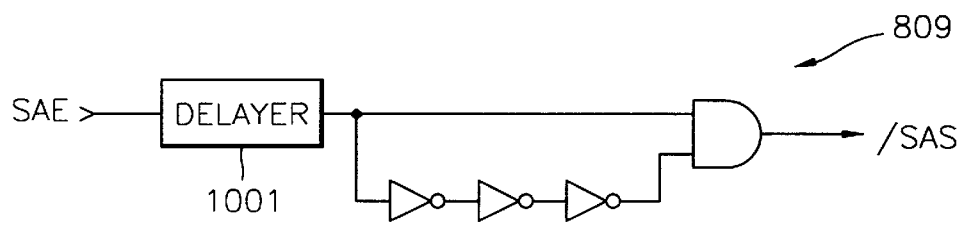
FIG. 10 is a detailed circuit diagram showing the second sense signal generator of FIG. 8.

FIG. 10 is a circuit diagram showing the second sense signal generator 809 of FIG. 8 in detail. Referring to FIG. 10, the sense amplifier sense signal/SAS is generated as a pulse in response to the sense amplifier enable signal SAE. However, the response of the sense amplifier sense signal/SAS to the sense amplifier enable signal SAE is delayed by a delay time $T_{DEL}$ by a delayer 1001. The delay time $T_{DEL}$ is preferably a time taken from the generation of the column access command to the turning on of the transmission switch for transmitting data of the pair of bit lines to the input and output line. The delay time $T_{DEL}$ is also the time taken for the clock signal CLK to generate the required number of reference clock cycles $T_1$.

Figure 11:
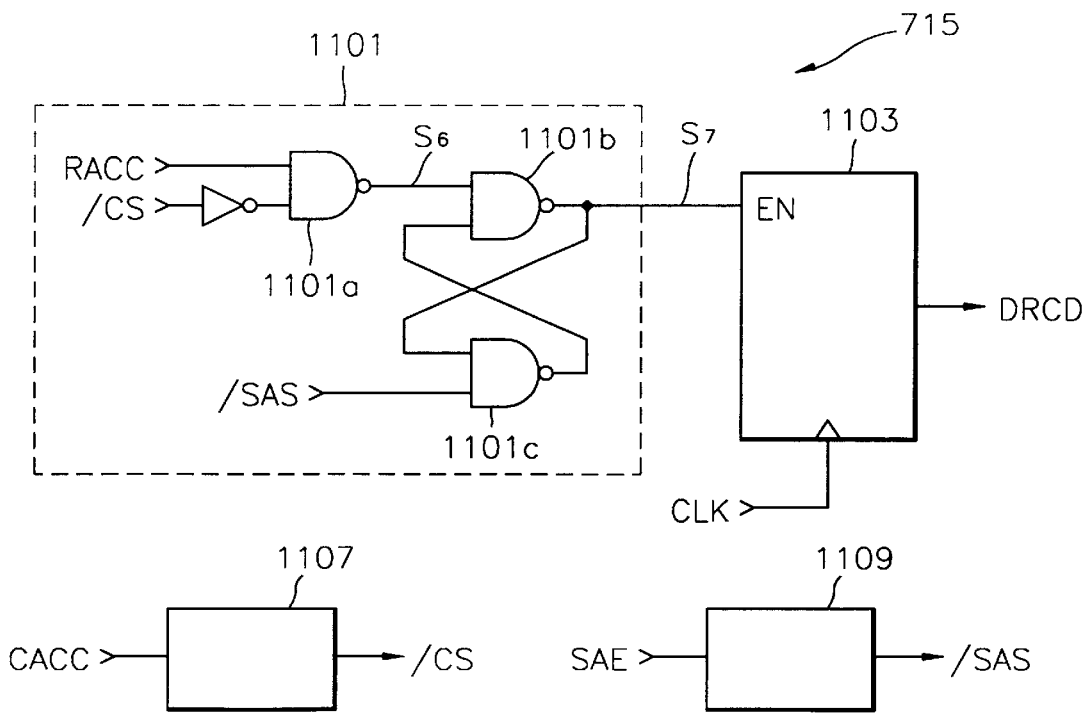
FIG. 11 is another detailed circuit diagram showing a second design for the counter of FIG. 7.

FIG. 11 is detailed circuit diagram of a second design for the counter 715 of FIG. 7. The counter 715 of FIG. 11 includes a logic unit 1101, a counter 1103, a first sense signal generator 1107, and a second sense signal generator 1109.

The logic unit 1101 includes three NAND gates 1101a, 1101b, and 1101c. The NAND gate 1101a generates an output signal $S_6$ activated by the generation of the row access command and the column access command. The NAND gates 1101b and 1101c use the output signal $S_6$ of the NAND gate 1101a and the sense amplifier sense signal/SAS as input signals, respectively. The NAND gates 1101b and 1101c are also cross-coupled to each other. Therefore, an output signal $S_7$ of the logic unit 1101 is activated in response to the generation of the column access command and is deactivated in response to the sense amplifier enable signal SAE.

The counter 1103 counts the number of clock cycles of the clock signal CLK generated in the activation period of the output signal $S_7$.

The first and second sense signal generators 1107 and 1109 of FIG. 11 can be implemented using the first and second signal generators 807 and 809 of FIG. 8. Therefore, a detailed description of the first and second signal generators 1107 and 1109 of FIG. 11 is omitted in this specification.

Figure 12:
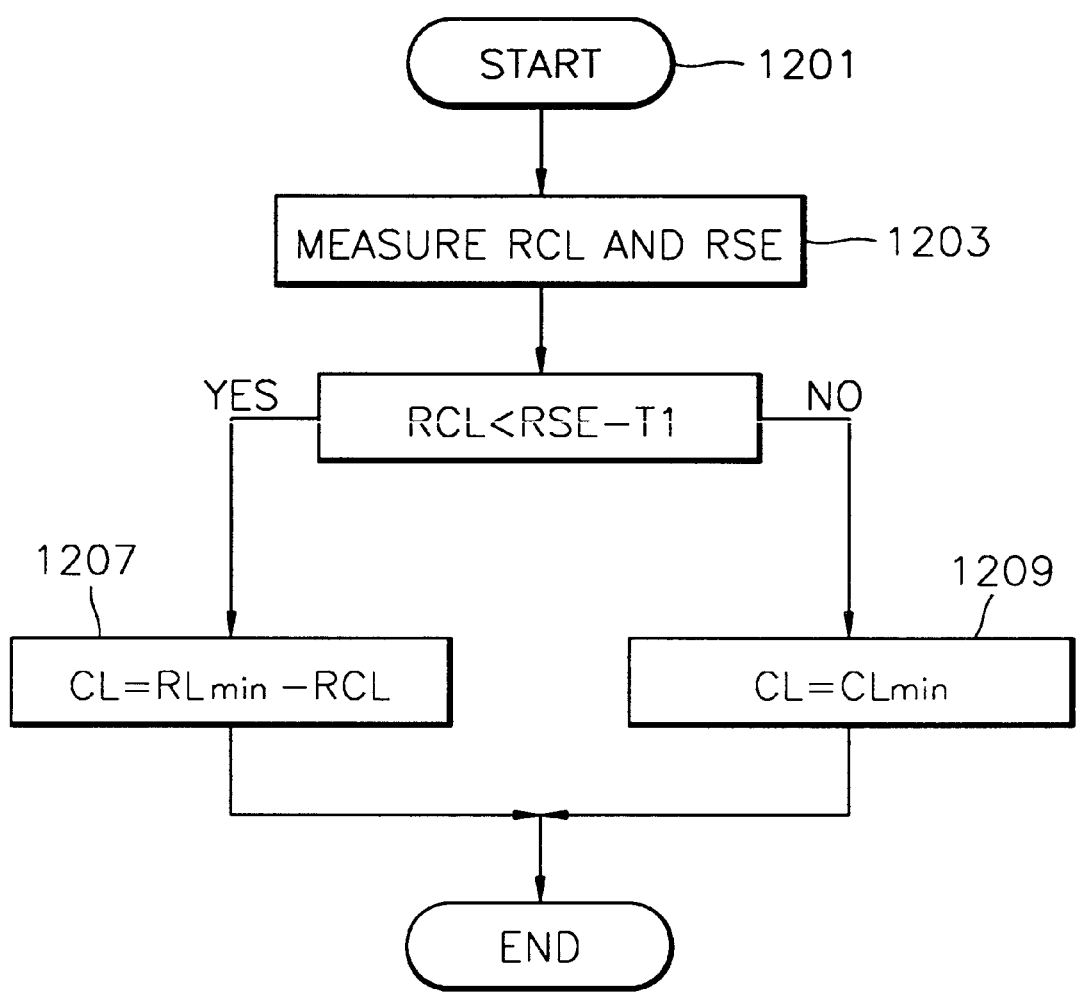
FIG. 12 is a flowchart describing a method of controlling CAS latency using an SDRAM according to a second preferred embodiment.
Figure 13:
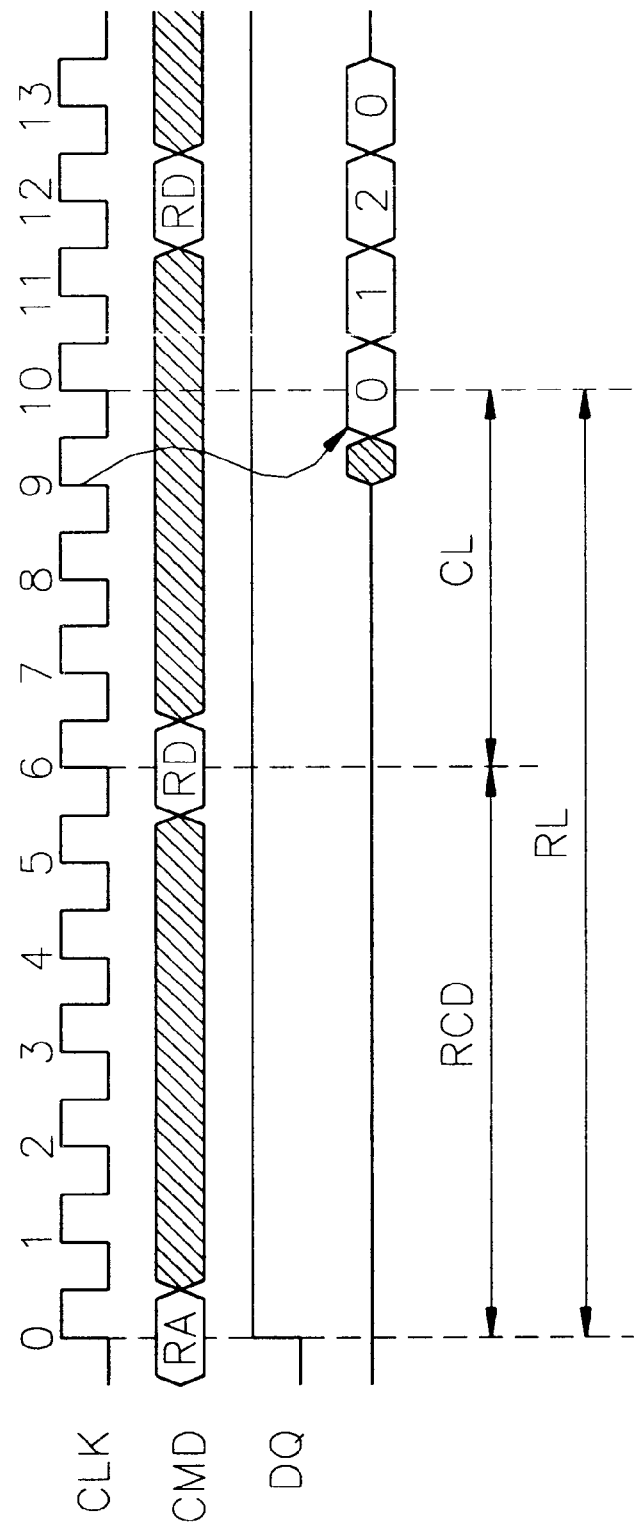
FIG. 13 is a view for describing latency from the application of a general row access command or a general column access command to the output of data.

FIG. 12 is a flow chart showing the method of controlling CAS latency using the SDRAM according to the second preferred embodiment. Referring to FIG. 12, the method of controlling CAS latency is described as follows. RCL and SAE are both measured inside the SDRAM (step 1203), and RCL is then compared with SAE (step 1205). If RCL is less than SAE and the difference between RCL and SAE is no less than the number of reference clock cycles $T_1$, the CAS latency CL is determined to be ($RL_{min}$–RCL) in step 1207. If RCL is not less than SAE or the difference between RCL and SAE is less than the number of reference clock cycles $T_1$, then the CAS latency CL is determined to $CL_{min}$ (step 1209).

The SDRAM according to the first preferred embodiment of the present invention receives $RCL_{min}$ from the outside of the SDRAM through the MRS, compares RCL with $RCL_{min}$, and controls the CAS latency CL according to the comparison result. The SDRAM according to the second preferred embodiment is different from the SDRAM of the first preferred embodiment in that the SDRAM measures RCL and SAE, compares RCL with SAE, and controls the CAS latency CL according to the comparison result.

It is possible to appropriately perform the posted CAS latency operation and the general CAS latency operation by the SDRAM according to the SDRAM and according the method of controlling CAS latency of the present invention.

While this invention has been particularly shown and described with reference to preferred embodiments, it will be understood by those skilled in the art that various changes in form and details may be made without departing from the spirit and scope of the invention as defined by the appended claims.

What is claimed is:

1. A synchronous DRAM (SDRAM), operating in synchronization with a clock signal, the SDRAM comprising:
   a memory bank having a plurality of memory cells arranged in rows and columns;
   a column decoder for selecting a column of the memory bank;
   a column address input port for inputting a column address that selects the column of the memory bank;
   a first shift register for delaying the column address by a first number of delay clock cycles between the column address input port and the column decoder; and
   a delay counter for sensing the number of clock cycles RCL of the clock signal from the application of the row access command to the application of the column access command with respect to the same bank, and for providing a first delay clock control signal to the first shift register,
   wherein $RL_{min}$ is the minimum number of clock cycles of the clock signal required from the application of a row access command to the output of the data of the memory and $CL_{min}$ is the minimum number of clock cycles of the clock signal required from the application of a column access command to the output of the data of the memory cell, and
   wherein the first delay clock control signal has information on the difference between RCL and ($RL_{min}-CL_{min}$), and the first number of delay clock cycles is determined in response to the difference between RCL and ($RL_{min}-CL_{min}$).

2. A synchronous DRAM, as recited in claim 1, wherein the first shift register comprises:
   a plurality of registers serially coupled to each other for continuously transmitting the column address in response to the clock signal of every period; and
   a multiplexer for selectively providing one signal among the output signals of the plurality of registers to the column decoder.

3. A synchronous DRAM, as recited in claim 2, wherein the registers are D flip-flops.

4. A synchronous DRAM, as recited in claim 1, wherein the delay counter comprises:
   a down counter for reducing the value of ($RL_{min}-CL_{min}$) by 1 in response to the clock signal;
   a register for providing a first delay clock control signal having information on an output value stored as an output value of the down counter when the column access command is generated or an output value of the down counter having the value of 0 to the first shift register after the row access command is generated;
   a clock controller that is disabled when the output value of the down counter is 0, for providing a first clock control signal which is enabled by the generation of the row access command and responds to the clock signal to the down counter; and
   a logic unit disabled by the generation of the column access command, for providing a second clock control signal that is enabled by the generation of the row access command and responds to the first clock control signal.

5. A synchronous DRAM, as recited in claim 4, the delay counter further comprising an RCL measuring unit for providing an output signal activated by the generation of the row access command and disabled by the generation of the column access command to the logic unit.

6. A synchronous DRAM, as recited in claim 1, further comprising:
   a second shift register for delaying the output data of a selected memory cell by $CL_{min}$; and
   a buffer for buffering the output signal of the second shift register and delaying the output signal of the second shift register by a second number of delay clock cycles in response to a second predetermined delay clock control signal.

7. A synchronous DRAM, as recited in claim 6, the SDRAM further comprising a buffer controller for generating a second delay clock control signal for controlling the buffer, the buffer controller comprising:
   a first register for delaying the column access command by the second number of delay clock cycles and outputting the delayed column access command, every cycle of the clock signal; and
   a second register for delaying the output signal of the first register by $CL_{min}$ and generating a second delay control signal for controlling the buffer.

8. A synchronous DRAM (SDRAM) operating in synchronization with a clock signal, the SDRAM comprising:
   a memory bank having a plurality of memory cells arranged in rows and columns;
   a column decoder for selecting a column of the memory bank;
   a sense amplifier for amplifying data from the selected column;
   a column address input port for inputting a column address for selecting the column of the memory bank;
   a first shift register for delaying the column address by a first number of delay clock cycles between the column address input port and the column decoder; and
   a delay counter for providing a first delay clock control signal having information on the difference between RCL and SAE to the first shift register,
   wherein RCL is the number of clock cycles of the clock signal from the application of a row access command to the application of a column access command with respect to the same bank,
   wherein SAE is the number of clock cycles of the clock signal from the application of the row access command to the point of time at which the sense amplifier is enabled are determined, and
   wherein the first number of delay clock cycles is determined in response to the difference between RCL and SAE.

9. A synchronous DRAM, as recited in claim 8, wherein the first shift register comprises:
   a plurality of registers serially coupled to each other, for continuously transmitting the column address every cycle of the clock signal; and
   a multiplexer for selectively providing one signal among the output signals of the registers to the column decoder in response to the difference between RCL and SAE.

10. A synchronous DRAM, as recited in claim 9, wherein the registers are D flip-flops.

11. A synchronous DRAM, as recited in claim 8, wherein the delay counter comprises:
   a first counting circuit for counting SAE and generating a first number of clock cycles;
   a second counting circuit for counting RCL and generating a second number of clock cycles; and
   a subtracter for calculating a third number of clock cycles by subtracting the first number of clock cycles from the second number of clock cycles and using 0 as the third number of clock cycles when the first number of clock cycles is larger than the second number of clock cycles.

12. A synchronous DRAM, as recited in claim 11, wherein the first counting circuit comprises:

a first logic latch unit for generating a first logic latch output signal activated by the generation of the row access command and deactivated by the activation of the sense amplifier enable signal; and a first counter enabled in a period when the first logic latch output signal is activated, for counting the number of clock cycles of the clock signal generated in the activation period, and for generating the number of first clock cycles.

13. A synchronous DRAM, as recited in claim 12, wherein the second counting circuit comprises:

a second logic latch unit for generating a second logic latch output signal activated by the generation of the row access command and deactivated by the generation of the column access command; and a second counter enabled in a period where the second logic latch output signal is activated, for counting the number of clock cycles of the clock signal generated in the activation period, and for generating the number of second clock cycles.

14. A synchronous DRAM, as recited in claim 8, wherein the delay counter comprises:

a logic unit for generating a logic output signal that is activated in response to the generation of the column access command and is deactivated in response to a sense amplifier enable signal, the logic output signal operating to enable the sense amplifier; and a clock counter for counting the number of clock cycles of the clock signal generated in a period where the output signal of the logic unit is activated.

15. A synchronous DRAM, as recited in claim 8, further comprising:

a second shift register for delaying the output data of the memory cell by $CL_{min}$, where $CL_{min}$ is the minimum number of clock cycles of the clock signal required from the application of a column access command to the output of the data of the memory cell; and a buffer for buffering the output signal of the second shift register, and for delaying the output signal of the second shift register by the first number of delay clock cycles in response to a second delay clock control signal.

16. A synchronous DRAM, as recited in claim 15, further comprising a buffer controller for generating a second delay clock control signal for controlling the buffer, wherein the buffer controller comprises:

a first register for delaying the column access command by the first number of delay clock cycles and outputting the delayed column access command; and a second register for generating a second delay control signal for delaying the output signal of the first register by the first number of delay clock cycles and controlling the buffer every cycle of the clock signal.

17. A synchronous DRAM, as recited in claim 8, wherein the first delay clock signal is provided from outside of the SDRAM.

18. A synchronous DRAM (SDRAM) synchronized with a clock signal after predetermined column access strobe (CAS) latency has lapsed from a column access command, the SDRAM comprising:

a memory bank having a plurality of memory cells arranged in rows and columns; and a decoder for selecting one of the memory cells based on a column address and a row address, wherein the CAS latency is determined by the number of clock cycles of the clock signal from the application of a row access command to the application of a column access command with respect to the memory bank.

19. A synchronous DRAM (SDRAM), comprising:

a memory bank having a plurality of memory cells arranged in rows and columns; and a decoder for selecting one of the memory cells based on a column address and a row address, wherein $RL_{min}$ is the minimum number of clock cycles of the clock signal required from the application of a row access command to the output of the data of the selected memory cell, wherein $CL_{min}$ is the minimum number of clock cycles of the clock signal required from the application of a column access command to the output of the data of the selected memory cell, wherein RCL is the number of clock cycles of the clock signal from the application of a row access command to the application of a column access command with respect to the memory bank, and wherein a CAS latency, which is the number of clock cycles of the clock signal required from the application of the column access command to the output of data, is determined to be ($RL_{min}$–RCL) when RCL is less than ($RL_{min}$–$CL_{min}$), and is determined to be $CL_{min}$ when RCL is not less than ($RL_{min}$–$CL_{min}$).

20. A synchronous DRAM, as recited in claim 19, wherein ($RL_{min}$–$CL_{min}$) is input from the outside of the SDRAM.

21. A synchronous DRAM (SDRAM) operating in synchronization with a clock signal, the SDRAM comprising:

a memory bank having a plurality of memory cells arranged in rows and columns;

a column decoder for selecting the column of the memory bank;

a sense amplifier for amplifying data from the selected column;

wherein $RL_{min}$ is the minimum number of clock cycles of the clock signal required from the application of a row access command to the output of the data of the selected memory cell, $CL_{min}$ is the minimum number of clock cycles of the clock signal required from the application of a column access command to the output of the data of the selected memory cell, RCL is the number of clock cycles of the clock signal from the application of a row access command to the application of a column access command with respect to the memory bank, SAE is the number of clock cycles of the clock signal from the application of the row access command to the point of time at which the sense amplifier is enabled, and wherein a CAS latency, which is the number of clock cycles of the clock signal required from the application of the column access command to the output of data, is determined by the difference between RCL and SAE.

22. A synchronous DRAM, as recited in claim 21, wherein the CAS latency is determined to be ($RL_{min}$–RCL) when RCL is less than SAE and the difference between RCL and SAE is no less than the predetermined number of reference clock cycles, and is determined to be $CL_{min}$ when RCL is no less than SAE and the difference between RCL and SAE is no more than the number of reference clock cycles.

23. A method of controlling CAS latency of an SDRAM, synchronized with a clock signal, that includes a memory bank having a plurality of memory cells arranged in rows and columns and outputs the data of a selected memory cell, the method comprising:

inputting a quantity ($RL_{min}$–$CL_{min}$) from the outside of the SDRAM, where $RL_{min}$ is the minimum number of clock cycles of the clock signal required from the application of a row access command to the output of the data of the selected memory cell, and $CL_{min}$ is the minimum number of clock cycles of the clock signal required from the application of a column access command to the output of the data of the selected memory cell;

comparing RCL with ($RL_{min}$–$CL_{min}$), where RCL is a number of clock cycles of the clock signal from the application of a row access command to the application of a column access command with respect to the memory bank;

determining CAS latency, which is the number of clock cycles of the clock signal required from the application of the column access command to the output of the data, to be ($RL_{min}$–RCL) when RCL is less than ($RL_{min}$–$CL_{min}$); and determining the CAS latency to be $CL_{min}$ when RCL is no less than ($RL_{min}$–$CL_{min}$).

24. A method of controlling CAS latency of an SDRAM which includes a bank having a plurality of memory cells arranged in rows and columns that outputs the data of a selected memory cell in synchronization with the clock signal, the method comprising:

sensing RCL, where RCL is the number of clock cycles of the clock signal from an application of a row access command to an application of a column access command;

sensing SAE, where SAE is the number of clock cycles of the clock signal from application of the row access command to a point of time at which a sense amplifier is enabled;

comparing RCL with SAE;

determining CAS latency, which is the number of clock cycles of the clock signal required from the application of the column access command to the output of the data, to be ($RL_{min}$–RCL) when RCL is less than SAE and the difference between RCL and SAE is not less than a predetermined number of reference clock cycles; and determining the CAS latency to be $CL_{min}$ when RCL is not less than SAE or the difference between RCL and SAE is less than the predetermined number of reference clock cycles, wherein $RL_{min}$ is the minimum number of clock cycles of a clock signal required from the application of a row access command to the output of the data of the selected memory cell, and $CL_{min}$ is the minimum number of clock cycles of the clock signal required from the application of a column access command to the output of the data of the selected memory cell.

* * * * *